US006461885B1

(12) United States Patent
Lupo et al.

(10) Patent No.: US 6,461,885 B1
(45) Date of Patent: Oct. 8, 2002

(54) METHOD OF FABRICATING AND STRUCTURE OF AN ACTIVE MATRIX LIGHT-EMITTING DISPLAY DEVICE

(75) Inventors: Donald Lupo, Frankfurt; Akio Yasuda, Stuttgart, both of (DE)

(73) Assignee: Sony International (Europe) GmbH, Berlin (DE)

( * ) Notice: Subject to any disclaimer, the term of this patent is extended or adjusted under 35 U.S.C. 154(b) by 0 days.

(21) Appl. No.: 09/415,807

(22) Filed: Oct. 11, 1999

(30) Foreign Application Priority Data

Oct. 13, 1998 (EP) .............................................. 98119323

(51) Int. Cl.$^7$ ......................... H01L 21/84; H01L 51/40; H01L 51/20; H01L 27/15
(52) U.S. Cl. ............................. 438/29; 438/455; 438/99
(58) Field of Search ........................... 438/29, 30, 455, 438/99; 257/40

(56) References Cited

U.S. PATENT DOCUMENTS

| 5,438,241 A | * | 8/1995 | Zavracky et al. | |
| 5,550,066 A | * | 8/1996 | Tang et al. | 438/30 |
| 5,737,041 A | * | 4/1998 | Holmberg | |
| 5,821,688 A | * | 10/1998 | Shanks et al. | 313/498 |
| 5,937,272 A | * | 8/1999 | Tang | 438/30 |
| 6,340,789 B1 | * | 1/2002 | Petritsch et al. | 136/263 |

FOREIGN PATENT DOCUMENTS

| EP | 0 777 281 A2 | 6/1997 |
| EP | 0 845 812 A2 | 6/1998 |
| WO | WO 96/33593 | 10/1996 |
| WO | WO 98/07202 | 2/1998 |

OTHER PUBLICATIONS

Chayanov B A Et Al: "Protection of Organic Thin–Film Light–Emitting Diodes" Technical Physics Letters, vol. 23, No. 3, Mar. 1997, p. 207 XP000619731 *p. 207, Left–Hand col. Line 4–Line 7*.

Nuesch F Et Al: "Dirivatized Electrodes in the Construction of Organic Light Emitting Diodes" Advanced Materials, vol. 9, No. 3, Feb. 1997, pp. 222–225, XP000682002 *p. 222, Right–Hand col., Line 23–Line 27*.

Cabrera Et Al.: "Blue Transparent Langmuir Blodgett Films for Second Harmonic Generation" Nonlinear Optics, vol. 9, 1995, pp. 161–169, XP002095803 *The Whole Document*.

Database WPI Section Ch, Week 9436 Derwent Publication LTS., London, GB; AN 94–291165 XP002095804 & JP 06 220442 A (Toyo Ink Mfg Co), Aug. 9, 1994 *Abstract*.

* cited by examiner

Primary Examiner—Mary Wilczewski
(74) Attorney, Agent, or Firm—Frommer Lawrence & Haug LLP; William S. Frommer; Mark W. Russel

(57) ABSTRACT

The invention concerns active matrix light-emitting display devices and a method of their fabrication wherein the problem of chemically unstable cathode electrode layers is solved, simultaneously offering a considerably higher aperture ratio and brightness with rather low driving voltages. These advantages are achieved by separate manufacture of a first substrate bearing TFT elements of which the source and drain regions are at first covered by a non-conductive passivation layer followed by a deposition of a chemically stable cathode material layer and deposition of an appropriately selected EL material layer. The anode side substrate is independently prepared by at first depositing an anode layer followed by application of an EL layer, then the two independently manufactured layered substrates are alligned face-to-face and are combined to a unified structure under application of heat and pressure, the temperature being selected to have the glass transition temperature of said EL layers in case of polymeric EL material or to have the phase transition temperature for solid to liquid crystalline state or isotropic state in case of crystalline EL material.

9 Claims, 8 Drawing Sheets

Figure 1A:
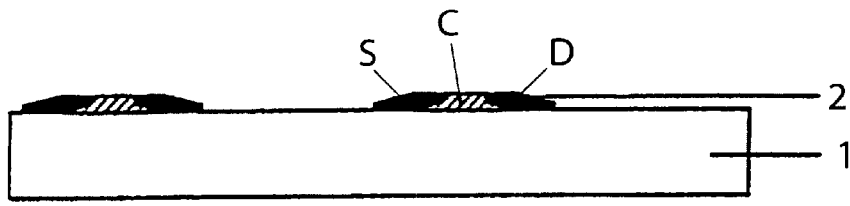
Figure 1B:
Figure 1C:
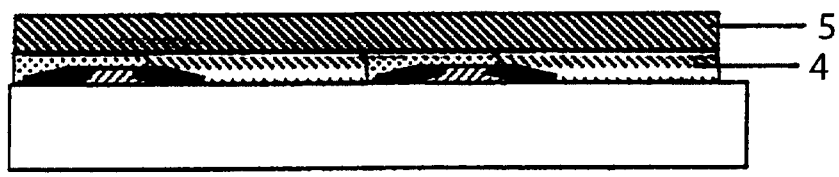
Figure 1D:
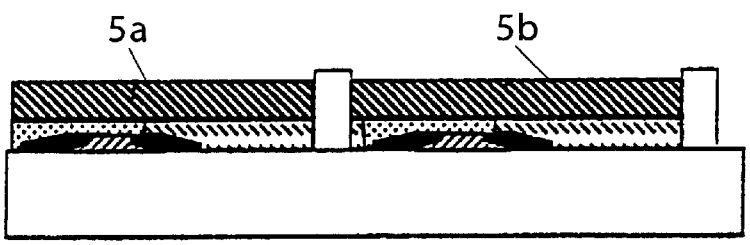

METHOD OF FABRICATING AND STRUCTURE OF AN ACTIVE MATRIX LIGHT-EMITTING DISPLAY DEVICE

The invention relates to a method of fabricating and to the set-up of an active matrix display device formed of a plurality of pixels and comprising at least one thin film transistor element (in the following TFT element) on a first substrate for each pixel, a low work function material layer, in particular a structured cathode layer forming or contacting a pixel electrode layer, an active organic and/or polymeric electroluminescent material layer (EL layer) covering at least said low work function conducting layer, an electrically conducting high work function layer, in particular an anode layer on said EL layer and structured into elements desired for display as well as a second substrate covering said layered arrangement.

Light-emitting devices based on organic and polymeric electroluminescent (EL) materials are known (see Lit. [1]). For achieving a specific colour emission efficiency of such types of light-emitting devices, WO 96/03015 A1 describes an advanced fabrication process for a conjugated polymers based two part integrally connected light-emitting device, in which each polymer layer is separately pretreated, e.g. by a stretching process. The advantages of a polymer based light-emitting devices, in particular diodes, are high brightness with low power consumption and low driving voltages. The device structure is a relatively simple metal-polymer-transparent electrode sandwich wherein the material of the transparent electrode may be indium tin oxide (ITO). It is there-fore realistic and principally known to combine light-emitting polymer EL devices with active matrix driving like thin film transistors (TFTs) as proposed for example in EP-0 845 770 A1 or U.S. Pat. No. 5,747,928.

Typically, such devices require two electrodes of differing work function, at least one of which is transparent: one high work function anode (e.g. ITO, fluorine-dopen tin oxide, or gold) for hole injection and a low work function cathode (e.g. Mg, Al, Li, Ba, Ca) for electron injection into the organic or polymeric material. Up to now the transparent electrode in efficient devices is always the anode, which is in most cases applied to the substrate before diode preparation. Sputtering of ITO onto a finished device has been used, but the efficiency is poor and such processes are expected to damage the active polymer or organic layer. Frequently, but not necessarily, such devices comprise separate layers for electron and hole injection transport as for example proposed in the above mentioned WO-document, and occasionally in addition they also sometimes comprise an additional light-emitting layer sandwiched between the hole- and the electron-transport layers (see Lit. [2]). Flexible devices on polymeric substrates have also been reported wherein such substrates are coated with a high work function electrode, usually ITO and/or polyaniline (see Lit. [3]).

Active matrix liquid crystal displays (LCDs) driven by TFTs are commercially widespread, for example in notebook computers. In TFT/LCDs, an abbreviation of thin film transistor-addressed liquid crystal displays, each pixel element (pixel) is controlled by a thin film transistor. TFT/LCDs create a whole new world of technology in consumer electronics and in computer and communication systems. The market for TFT/LCDs is now growing much faster than expected and has an impact on new application fields, as well as conventional fields.

The structure of a single TFT in a matrix type arrangement of hundreds of thousands of TFTs is a FET (field effect transistor) and a pixel electrode. The pixel electrode is contacted to the source (or drain) electrode of the FET, and thus the effective window area (aperture ratio) is reduced by the size of the transistor area. The aperture ratio governs the brightness of the panel, thus the larger the aperture ratio becomes the brighter the display panel is achieved.

The concept of TFT/LCDs is not new, but rather old. As early as 1966 Weimer proposed the possibility of using TFTs as display switches (see Lit. [4]). A more detailed concept was described in 1971 (Lit. [5]), where the use of diodes or triodes (transistors) was discussed as switches for active matrix liquid crystal displays. The use of storage capacitors inplemented in parallel with the liquid crystal cell capacitor was also mentioned.

Hydronated amorphous silicon (a-Si:H) was a late arrival in TFT technologies. However, it had a great influence in achieving practical TFT/LCDs. Since the first report by the Dundee group (Lit. [6]), a-Si:H-TFT has been recognized as a suitable device for TFT/LCDs. So far the combination of TFT and LCD technologies has been greatly growing and the market is already rather large.

However, the principle problems of TFT/LCDs are
  a large viewing angle dependence if the LCD due to the application and use of twisted nematic (TN) type liquid crystals,
  considerable dependence of the switching speed on temperature because the switching is greatly dependent on the viscosity of the liquid crystal itself, and
  the liquid crystal injection process, necessary for cell filling takes several hours.

As mentioned above, the demand for portable uses of flat panel displays is increasing leading to the request for thinner and lighter flat panel displays. One approach to this goal are the polysilicon-based TFT technologies which are also progressing, especially with a proposal for integrating the required shift register within the TFT panel, thus reducing the number of connection lines of the TFT panel.

Recently a poly-Si-TFT-addressed polymeric EL display was reported by Cambridge Display Technology. Also known are active matrix driven displays based on polymeric EL materials, wherein the active driving elements are thin film field effect transistors (TFTs) of polysilicon or organic TFTs based on oligothiophene (Lit. [5]). In these reports the TFIs are deposited onto the transparent substrate before preparation of the EL devices.

Also known are techniques to modify the work function of metallic and semiconductor surfaces by attachment of functionalized dipolar layers, e.g. through chemisorption or electrochemical attachment (see Lit. [6]). Such modification has been shown for materials such as ITO, CdTe and CdS. An LED device comprising a modified ITO electrode was recently reported (see Lit. [7]). According to theoretical analysis, the change in the work function is proportional to the dipole moment of the attached molecules and their concentration, and is inversely proportional to their dielectric constants.

Lamination is a well-known technique for combining desired qualities of two or more different materials into a composite layer system and involves joining of the layers under application of pressure and/or heat (see Lit. [8]). Preparation of photovoltaic cell based on polymers by laminating two parts together was recently reported by Friend et al. (see Lit. [9]). Cabrera et al. (see Lit. [10]) reported a class of biftnctional materials for non-linear optics which comprised an aromatic group, particularly a styryl group, functionalized at the 4 and 4' positions by trifluorosulfonate groups as an electron acceptor at one end and electron donor groups such as ethers, thioethers and amines on the other end. These materials exhibit high dipole moments while showing a relatively small visible light absorption. Due to the possibility of attaching further functional groups, e.g. alkyl chains, to both donor and acceptor groups it was possible to determine the direction of the dipole moment relative to the second function group. No applications of these materials in EL devices have been reported.

Bloor et al. (see Lit. [11]) have reported a class of molecules derived from TCNQ which exhibit dipole moments of up to 25–30 Debye. No applications of these materials to EL devices have been reported.

In addition to the conceptional inconsistencies of light-emitting devices briefly mentioned above, having regard to the problems of which the invention offers a solution, the following disadvantages, shortcomings or needs of the state of the art have been discovered by the inventors.

a. The low work function cathode materials needed for high efficiency devices are typically unstable against oxidation by oxygen or water. Because of this, such devices and displays comprising a matrix of such devices must be thoroughly encapsulated to eliminate water and oxygen from the device. This is particularly difficult when flexible devices on polymeric substrates are desired (see e.g. U.S. Pat. No. 5,747,928), because a transparent, flexible and thoroughly impervious barrier layer must be applied to the side of the device comprising the transparent electrode, and thus far no such materials with sufficient barrier properties have been reported.

b. A further disadvantage of the use of oxidation sensitive cathode materials is there incompatibility with standard photolithographic processing, which will be necessary to achieve high resolution multicolour displays at reasonable prices.

c. Under the current state of the art, it is necessary for the achievement of high efficiency devices to prepare the devices onto a transparent anode material deposited onto a substrate and to evaporate the cathode onto the organic and/or polymeric layers. This eliminates the possibility to modify the cathode work function by chemical means and to use more stable materials.

d. Furthermore, according to the state of the art, in active matrix displays comprising organic and/or polymeric EL devices it is necessary to apply the (non-transparent) TFTs to the substrate before preparation of the EL device. This is a problem because in emissive displays, in which each pixel element consists of a different device element like a TFT, it is difficult to obtain uniformity over the screen, because of the deviation of the each element's electrical porperties. In order to circumvent a deviation of the brightness over the screen, one should perform some compensation by a built-in circuit in or for each pixel element. If the additional circuits are fabricated in the TFT pixel, it means a reduction of the aperture ratio. With the conventional TFT concept, the aperture ratio is reduced even more with an increase of the resolution or number of the pixels on the panel.

With the above discussed observations and drawbacks in mind, it is an object of the invention to teach a modified or new manufacturing process and a new structure for active matrix display devices offering high resolution displays with a good uniformity of brightness over the screen and simultaneously showing a high aperture ratio.

The invention concerns displays comprising devices which contain organic or polymeric EL materials and its preparation and application, wherein solution to the problems and the objects described above can be achieved.

A method of fabricating an active display device according to the invention is defined in claim 1. Advantageous modifications and embodiments of such a manufacturing method are the subject-matter of dependent claims.

An active matrix display device and its specific structure according to the invention is the subject-matter of claim 10 with advantageous modifications and improved embodiments being defined in further dependent claims.

As mentioned above, the combination of TFTs and LEPs (light-emitting polymers) is promissing in terms of eliminating the viewing dependence and temperature dependence of the response speed in TFT/LCDs, which are crucial problems for displays available on the market. However, the current state of the art leads to poor aperture ratios for high resolution displays based on polymeric EL material.

The invention as defined in at least one of the appended claims solves the above problems by metal (pixel electrode) fabrication on the TFT side of one of the substrates, such that at least a major part of each TFT is burried under a pixel electrode allowing for an active matrix addressing of the polymeric EL pixels while maintaining a high aperture ratio even at high resolution.

The fabrication method according to the invention and the resulting product of an active matrix display device will be described in further details by way of examples and embodiments and with reference to the accompanying drawings of which FIG. 1A to 1K visualize sequences and intermediate results of process steps for an active-matrix display device according to the invention;

FIG. 2A to 2K exemplify basically the same process steps as FIG. 1 with an advantageous modification in FIG. $2A_2$;

FIG. 3A to 3K show basically the same process steps and intermediate production stages as FIGS. 2A to 2H with an advantageous modification in FIG. $3D_1$; and FIG. 4A to 4K show process steps and intermediate production stages corresponding to those of FIG. 3A to 3K with a further modification in FIG. $4G_1$.

A first sequence of process steps according to the invention and one embodiment of the device prepared thereby are described with reference to FIGS. 1A to 1K.

First, a matrix of TFTs 2, each comprising a source region S, a drain D and a gap or channel region C, is prepared on a substrate material 1, which may, but must not be transparent, and may be, but is not limited to silicon wafers, transparent glass or a transparent polymer material, e.g. PET, polysulfone, cycloolefinic copolymers or polycarbonates or flexible composite materials. The substrate may include reflective layers to reflect light emitted in the direction of the substrate.

One or in the case of a multi-colour display more (e.g. three or four) TFTs 2 can be assigned to each pixel of a display. The actual fabrication procedure for the TFTs up to this point can be almost the same as for conventional TFT substrates as used for liquid crystal displays.

Next, a non-conductive passivation layer 3, which may comprise inorganic (e.g. $SiO_2$) and/or organic (e.g. a cured photoresist) non-conductive materials, is applied in such a way as to cover the source electrode or source region S and the gap or channel region C but to leave at least some part of the drain electrode or drain region D exposed. This layer 3 may be applied using standard lithographic techniques but may also be applied using other techniques such as shadow mask evaporation (see FIG. 1B).

Subsequently a matrix of cathodes 5, which can cover also the area covered by the TFTs and which define the area of the pixels in a display device according to the invention is applied, for example by vacuum evaporation or sputtering. The cathode layer 5 (see FIG. 1C) may comprise but is not limited to Al, Mg, Ca, Ba, Li, Ag, In or any alloys comprising two or more of these metals. In a preferred embodiment of the invention a stable metal such as Al or alloys thereof is used, which is resistant to photolithographic processing. A cathode layer 5 may be structured into pixel elements 5a, 5b, . . . desired each for a display element by using conventional processes, such as dry etching by oxygen or tetrafluorocarbon etc., or by wet etching processes with e.g. $HNO_3/CH_3/COOH/H_3PO_4$.

It may be and usually it is advantageous to apply an additional flattening layer or partial layer 4 to the pixels in such a way as to create a flat surface at the top of the cathode layer 5 and the pixel electrodes 5a, 5b, . . . , respectively. This may for example be done by evaporation of further cathode material using for example a shadow mask or by spincoating of organic materials out of a solution. Alternatively the flattening layer 4 may be applied using the same methods before deposition of the cathode layer 5 (see FIG. 1C and 1D).

After structuring the pixel areas (FIG. 1D) one or more composite active organic and/or polymeric layer(s) is (are) applied to the cathode material, i.e. on top of the pixel areas. The composition of the layer(s) 6 may include any of the types of materials known in the literature or referred to in the state of the art. Coating may be done by spincoating, doctor blading, transfer printing, curtain coating, slot-dye coating, or printing techniques such as screen printing (see FIG. 1E).

On a second, preferably optically transparent substrate 8 (FIG. 1F), which may consist of but is not limited to any of the materials described above for the first substrate 1, a transparent high work function electrode, e.g. an anode 7 such as described in the state of the art is deposited. If it is desired for certain embodiments of the invention, the anode layer may be structured into the elements 7a, 7b, . . . desired for a display using standard methods such as lithography and etching. Structuring of the anode is, however, optional and may not be necessary even for high resolution displays. Subsequently one or more active organic and/or polymeric layers 6' are applied to the structured anode layer elements 7a, 7b, . . . , respectively. The composition of such polymeric layers may include any of the types of materials known in the literature or referred to in the description of the state of the art. Again, coating may be done by spin-coating, doctor blading, transfer printing, curtain coating, slot-dye coating, or other printing techniques such as screen printing.

Figure 1E:
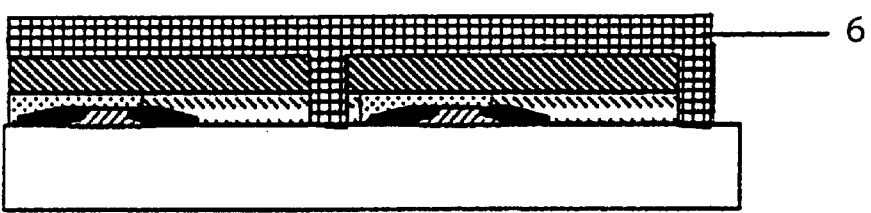
Figure 1F:
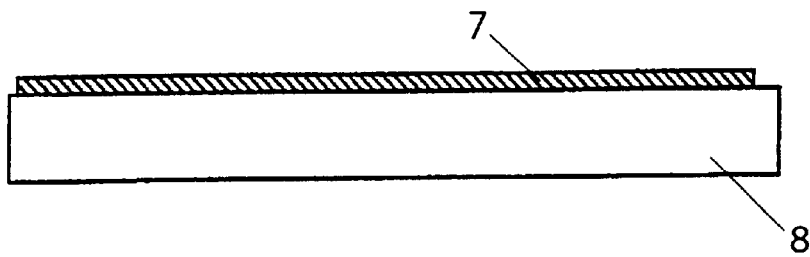
Figure 1G:
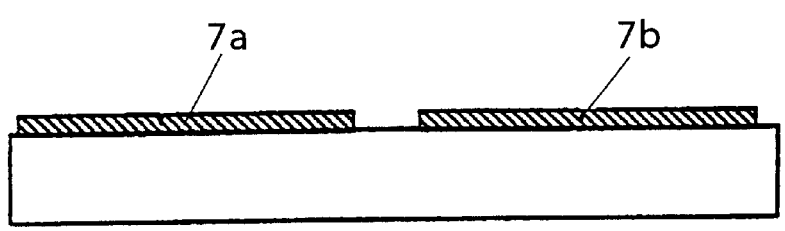
Figure 1H:
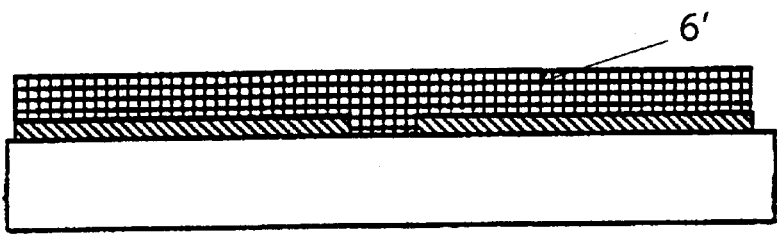

The process for manufacturing said two layered structures shown in FIG. 1E and FIG. 1H, respectively, is quite simple and favourable for mass production.

Figure 1K:
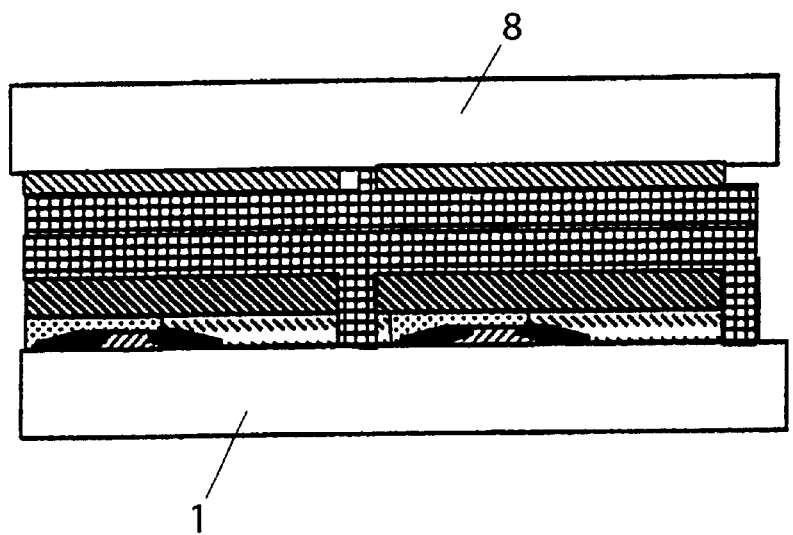
Figure 2A:
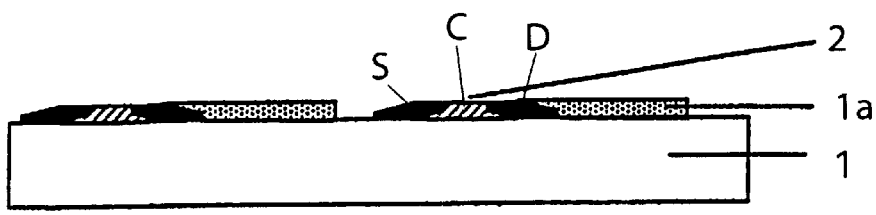
Figure 2B:
Figure 2C:
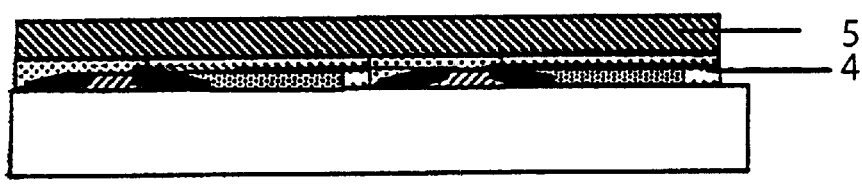
Figure 2D:
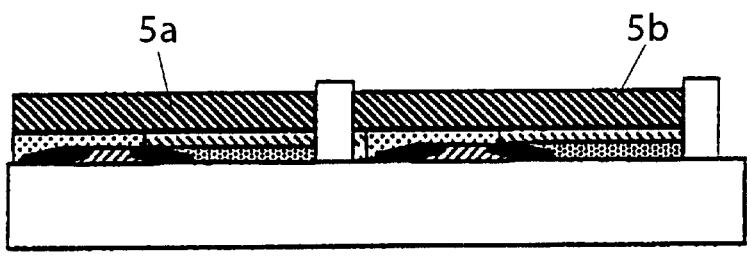
Figure 2E:
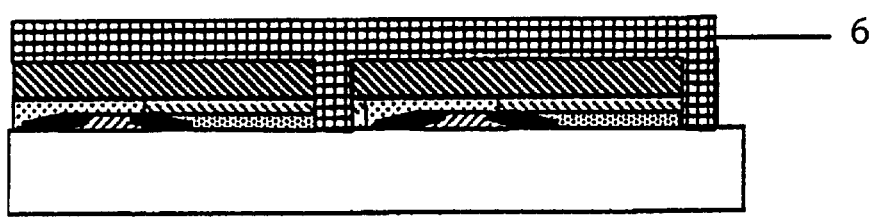
Figure 2F:
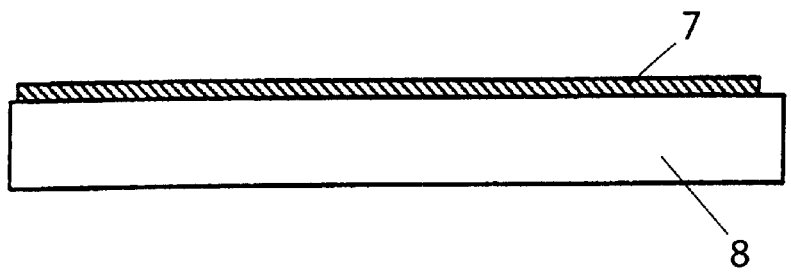
Figure 2G:
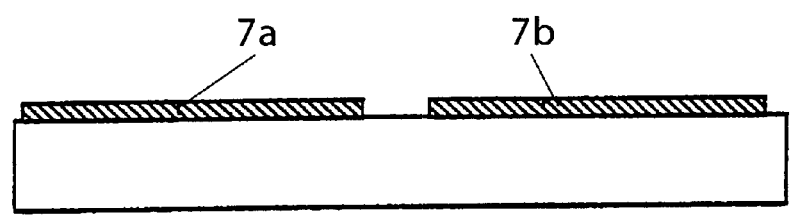
Figure 2H:
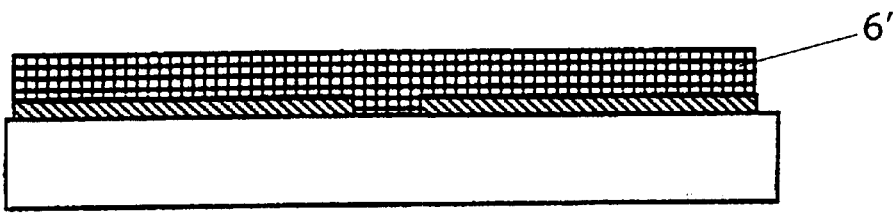
Figure 2K:
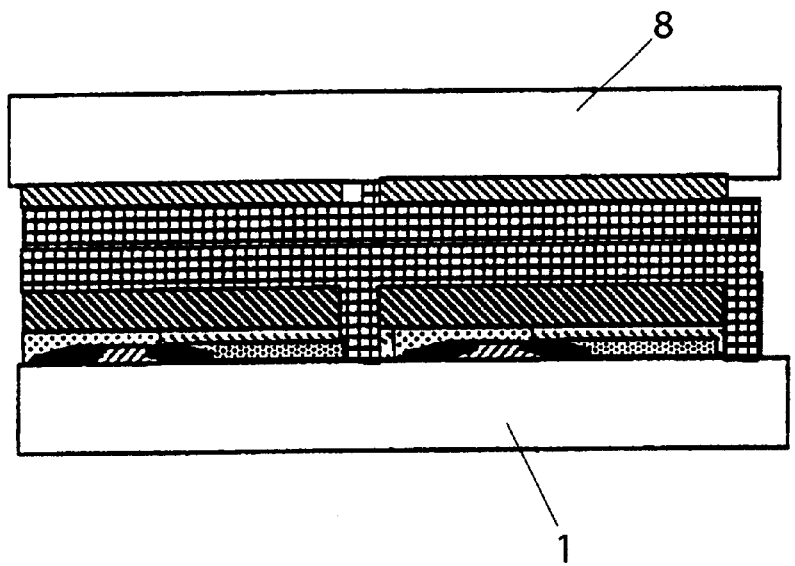
Figure 3A:
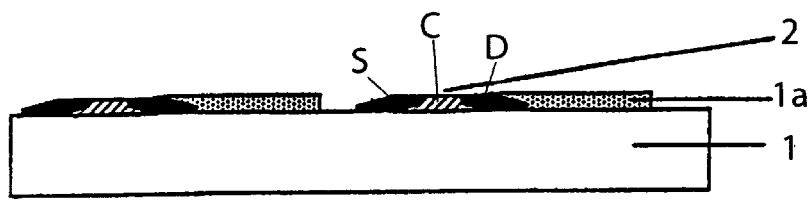
Figure 3B:
Figure 3C:
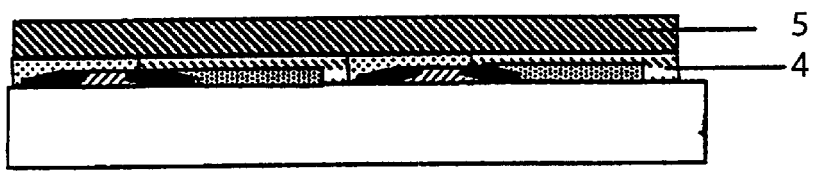
Figure 3D:
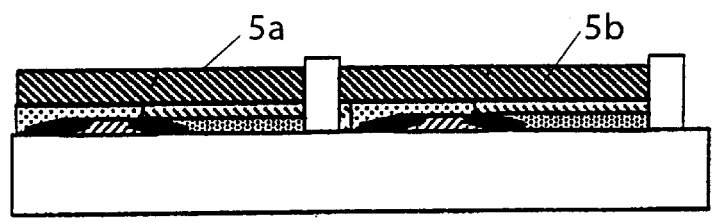
Figure 3E:
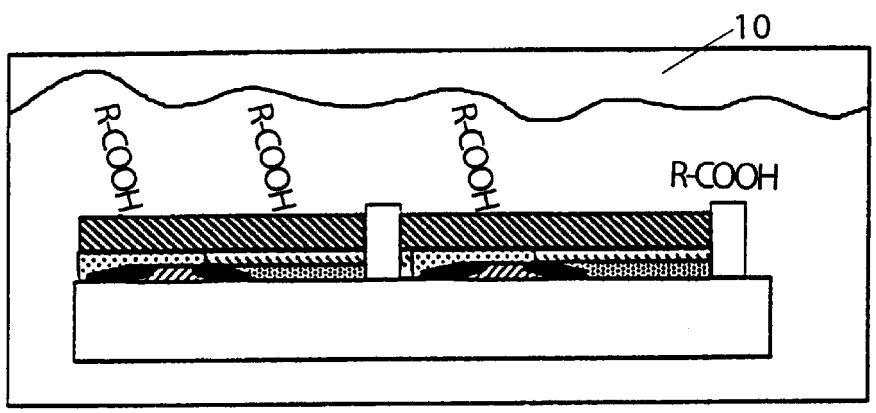
Figure 3E:
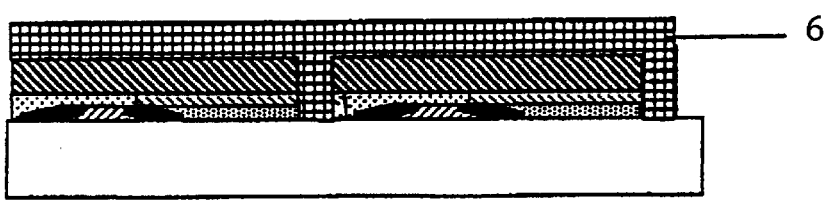
Figure 3F:
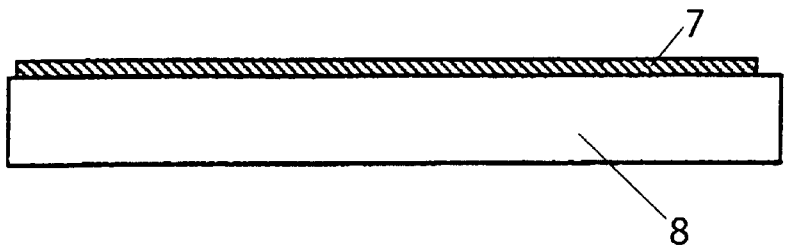
Figure 3G:
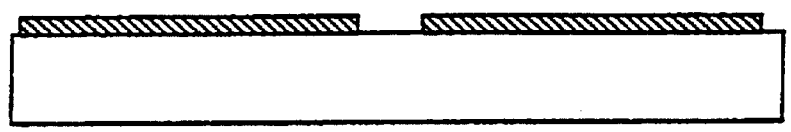
Figure 3H:
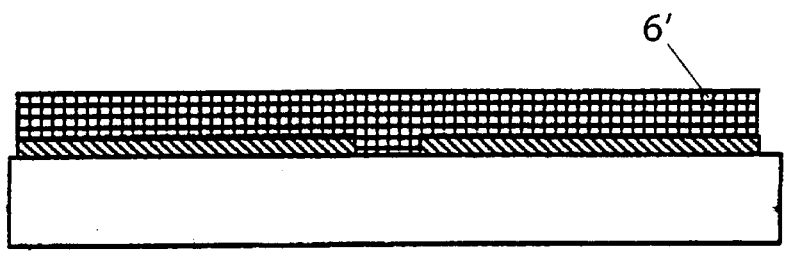
Figure 3K:
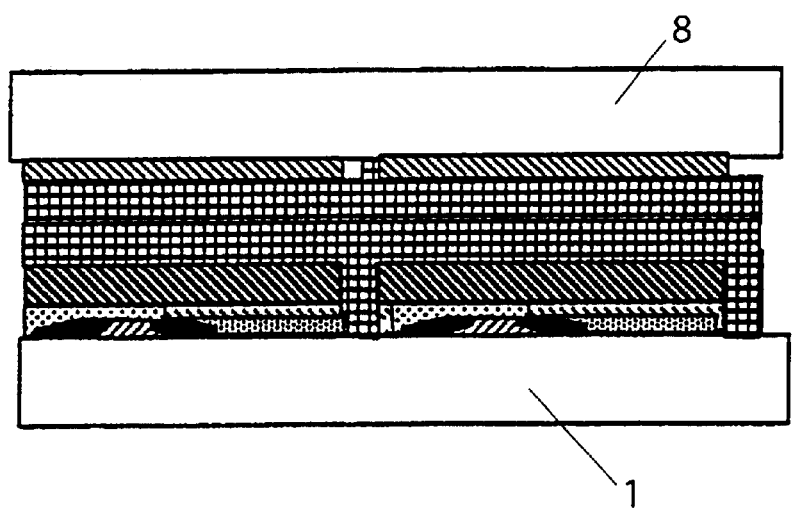
Figure 4A:
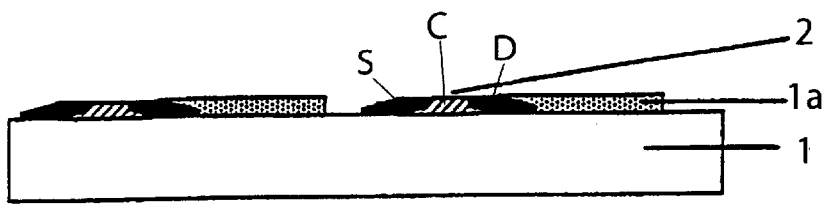
Figure 4B:
Figure 4C:
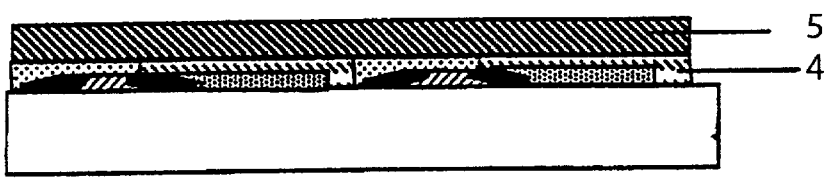
Figure 4D:
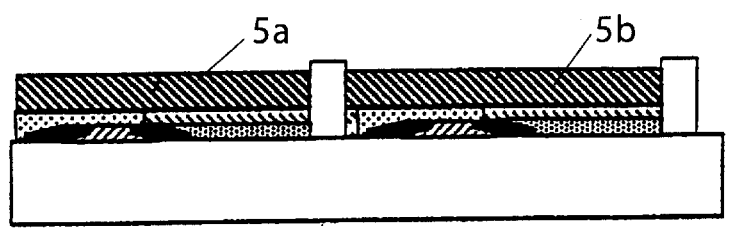
Figure 4E:
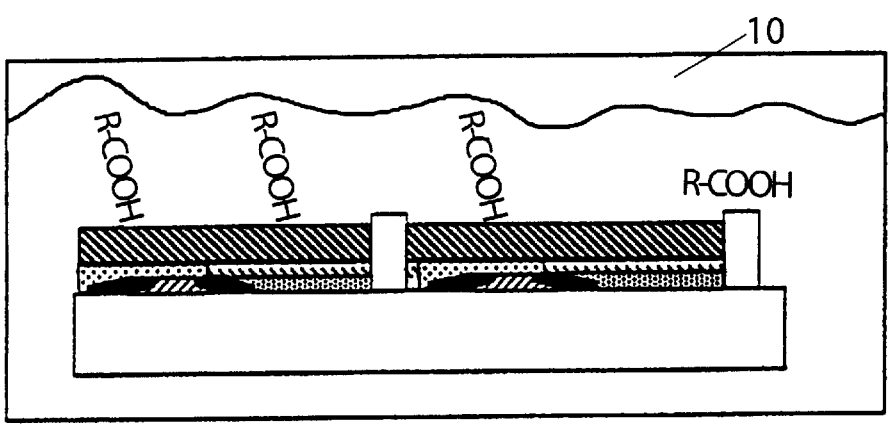
Figure 4E:
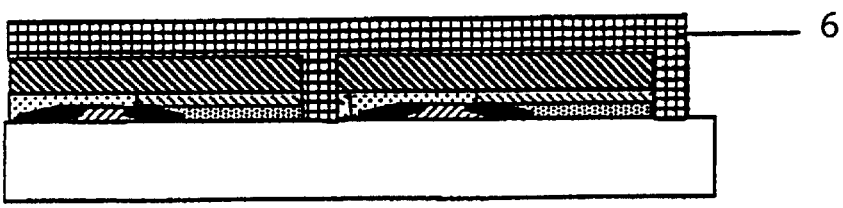
Figure 4F:
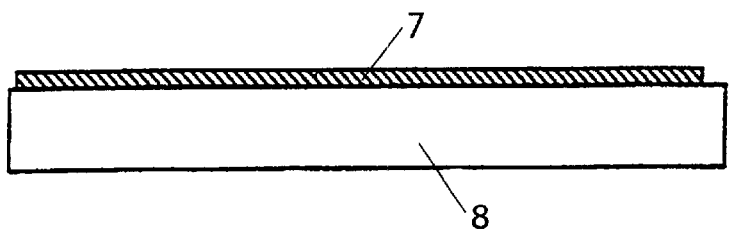
Figure 4G:
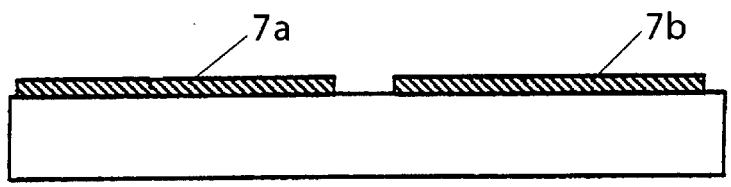
Figure 4H:
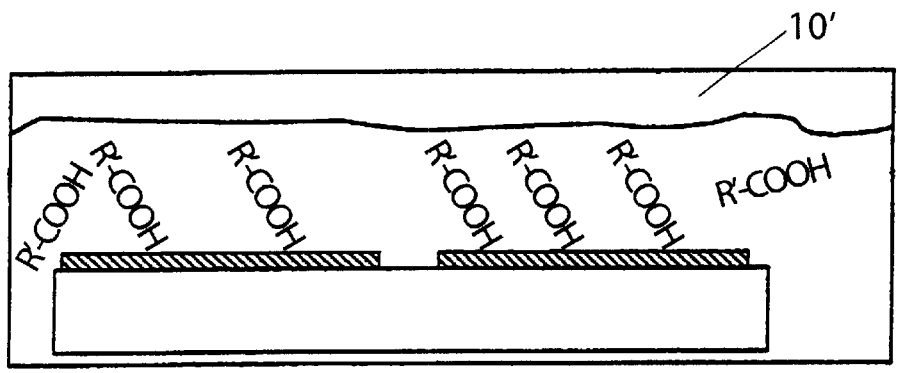
Figure 4H:
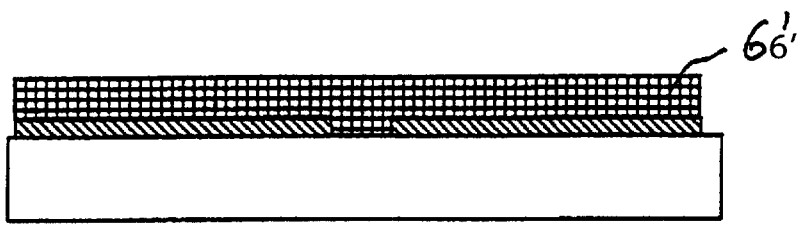
Figure 4K:
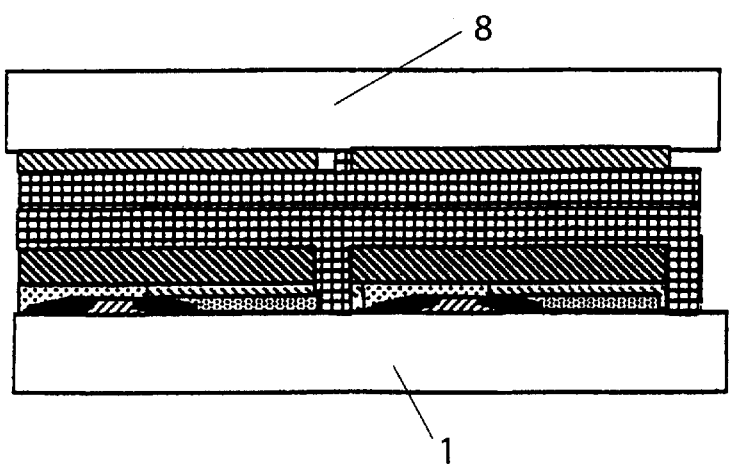

Subsequently the two coated substrates 1 to 6 and 8 to 6' are laminated together by application of heat and/or pressure as illustrated in FIG. 1K. As the polymers have glass transition temperature or if it is a liquid crystalline polymer, it must have phase transition temperature from solid to liquid crystalline state or isotropic state, in which the viscosity of the polymer decreases. Above these appropriately selected temperatures the application of pressure can lead to good physical and electrical contact between the two polymer layers 6 and 6'. Therefore, the temperature of lamination should be higher than the glass transition temperature of at least one of the organic and/or polymeric layers. After or during the process of lamination the device or display comprising such devices may be encapsulated if this is necessary or desired.

In another modified process or embodiment of the invention shown in FIG. 2A to FIG. 2K, a conventional TFT display substrate 1 such as used in the manufacture of liquid crystal displays is used as a substrate. Such substrates contain a matrix of TFTs 2 and of electrodes 1a usually made of ITO which define the pixel areas in such LCDs (see e.g. EP 0 845 770 A1). To this substrate 1 already provided with said TFT 2 and said electrodes 1a is first applied as above a non-conductive passivation layer 3 which covers the TFTs 2 but leaves part of the ITO electrodes la exposed.

Subsequently a matrix of cathodes, i.e. in large pixel areas 5a, 5b, . . . as above is deposited, which cover also the area containing the TFTs 2 and which in each case define the active area of a pixel in a device according to the invention.

According to this invention, each pixel area is defined by the respective area 5a, 5b, . . . of the cathode. Thus the cathode electrode is the respective pixel electrode. The source electrode area S and the drain D of the TFT are covered by the non-conductive passivation layer 3 while the drain electrode is in contact with the respective cathode/pixel electrode 5a, 5b. By this arrangement a high aperture ratio even at high resolution is achieved.

The further process steps depicted in FIG. 2F to 2K are essentially the same as those described above in connection with FIG. 1A to 1K. Again, if it is desired, an additional conductive layer 4 for the purpose of flattening the layer structure may be applied before or after deposition of the cathode layer 5 as described above.

In preferred process modifications and embodiments of the invention the pixel or cathode regions 5a, 5b, . . . and/or the anode regions 7a, 7b, . . . may be modified chemically before application of the organic and/or polymeric layer 6, 6' by absorption of functionalized dipoles. The functional groups which may be used to attach the dipoles may be, but are not limited to:

Carboxylic acids

Hydroxamine

Thiols

Phosphonates

Sulfonates

Amine.

The molecules which are attached to the pixel regions 5a, 5b, . . . and/or the anode regions 7a, 7b, . . . in order to modify them may comprise in one especially preferred embodiment of the invention the same functional group for light emission and/or charge transport as the active organic or polymeric layer in the device which is adjacent to the thus modified electrode.

In another especially preferred embodiment of the invention the attached molecules comprise structures of the following formula

where P is a π-conjugated system such as

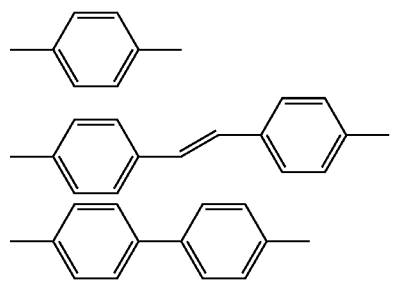

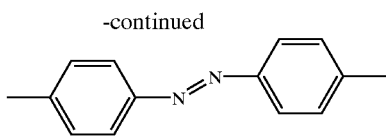

where $R_d$ is an electron donor group and $R_a$ is an electron acceptor group.

$R_d$ may be chosen from the following groups

NRR'

NR'R"

OR'

SR' where R, R' and R" are independently of each other equal H or $C_nH_{(2n+1)}R_{att}$, $R_{att}$=one of the above attachment groups or H, n=0–20, preferred 0–10, R' and R" may be the same or different, but one of R' and R" must be ≠H.

$R_a$ may be chosen from the following groups:

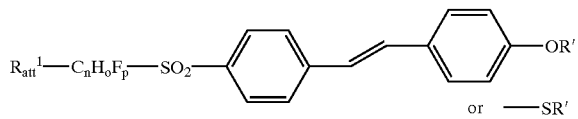

NO$_2$

COOR$_{att}$ where $o+p=2n+1$ $n=0$–20, preferred 0–10.

Under the condition that one of $R_{att}$≠H.

In a particularly preferred embodiment of the invention the attached molecules are of the form

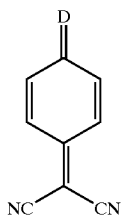

where either $R_{att}$ or $R_{att}^1$ is an attachment group.

In another particularly preferred embodiment of the invention molecules of the following form are used for surface modification:

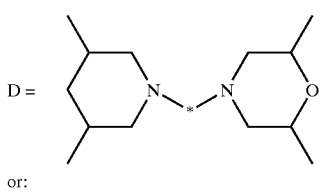

(1)

or:

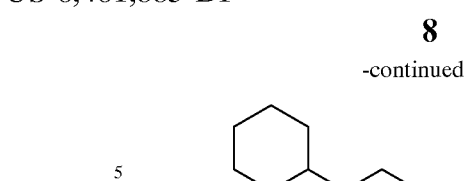

(2)

or:

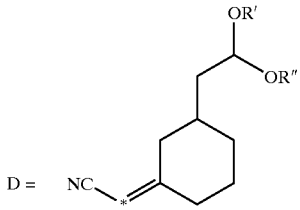

(3)

* = attachment position where R' and R" independently of each other=H or $C_nH_{(2n+1)}R_{att}$, $R_{att}$=one of the above attachment groups or H, n=0–20, preferred 0–10, and R' and R" may be the same or different, but one of R' and R" must be≠H.

Subsequent to the modification of the cathode 5 and/or the anode 7 the organic and/or polymeric material which is desired to be proximate to the modified electrode is applied. As mentioned above, this may be done by spincoating, doctor blading, transfer printing, curtain coating, slot-dye coating, or other printing techniques such as screen printing.

The main advantages of the invention over the state of the art are the following:

The process of separate lamination allows for both electrodes 5a, 5b, . . . and 7a, 7b, . . . to be chemically modified for optimization of charge carrier injection which is not possible when one electrode must be deposited directly on top of the organic layer. In addition, the lamination of two polymer coated films 6 and 8, respectively can lead to a convenient, inexpensive production process which is compatible with a further lamination step for encapsulation.

The modification of the electrodes 5a, 5b, . . . and 7a, 7b, . . . particularly the replacement of the usually unstable cathode by a stable electrode material like Al or an Al alloy, provides the possibility of manufacturing stable and efficient display devices, in comparison to the state of the art, forcing one to choose between stable cathode materials and high electron injection efficiency. Therefore, it will be possible in the future to prepare highly efficient organic light-emitting devices and displays using materials which are less stringent in their requirements for encapsulation and which are compatible with standard lithographic techniques for preparing structures.

The process of a separate lamination furthermore allows for the TFTs necessary for high resolution displays to be deposited before the preparation of the light emitting element and on the non-transparent side of the display device, thus enabling a display with a higher aperture ratio than is possible with the state of the art.

EXAMPLES

Example 1

A TFT panel of 513000 (1068×480) pixels and with a diagonal size of 1.35 inches (3,43 cm) is selected and an Al electrode (e.g. 5 in FIG. 1C) is vacuum evaporated at a thickness of 50 nm. The panel is photo resist coated and processed by a usual photolitho-graphic process and dry etched with oxygen at a pressure of $10^{-3}$ torr only at data and gate line areas. The etching rate is 100 nm/min.

Subsequently (poly)octylfluorene of a molecular weight of 4000 dissolved in p-xylene at a concentration of ca. 20 mg/ml is spin coated onto the thus prepared substrate. The spin coater condition is 100 rpm for 4 seconds and then 3000 rpm for 30 seconds to obtain a 70 nm thick film 6 on the Al electrode (cathode 5a, 5b, . . . in FIG. 1D) of the TFT panel.

On a second substrate 8, which comprises 0.7 mm thick Corning 7059 glass with a 50 nm ITO film 7, which may be structured as needed using standard lithographic techniques (FIG. 1F), a 70 nm layer 6' of poly(octylfluorene) is deposited as above, is set on a previously applied polyfluorene film.

Then the TFT panel (FIG. 1E) is placed on a hot plate which is set at 180° C. and kept at this temperature for 3 min. The second substrate (FIG. 1H) is applied to the first so that the two polymer layers 6, 6' are in face-to face contact with each other and heating is continued for another 3 min. Finally, a weight of 1 kg is applied on the combined panel under maintenance of the same temperature (see FIG. 1K).

The pressure at heat is maintained for 10 min. Subsequently the whole device is cooled at a rate of 0.5° C./min.

The glass edges of the laminated device are encapsulated with epoxy resin to keep out water and oxygen.

With this process and the device structure mentioned above, a TFT/LEP display with 513000 pixels and a diagonal size of 1.35" (3.43 cm) is obtained which can have a brightness of 10 Cd/m$^2$ and the driving voltages are below 15 V.

Example 2

A display device is prepared as in Example 1 with the following modifications (see FIGS. 3A to 3K):

Between the etching of the Al electrode (cathode pixels 5a, 5b) and the deposition of layer 6 of poly(octylfluorene) the panel is dipped into a breaker 10 (FIG. 3D$_1$) containing a 5 mg/ml solution in a mixture of acetonitrile and ethyl alcohol of the following composition for 5 minutes:

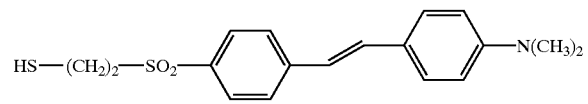

Subsequently the panel is rinsed in ethanol and dried under air at 50° C. for 5 min before deposition of the polymer layer 6. The rest of the preparation is as described in Example 1.

With the process of Example 2 and the structure described above, a TFT-LEP display with 513000 pixels and a diagonal size of 1.35" (3.43 cm) is obtained with a brightness of about 50 Cd/m$^2$ and with driving voltages below 15 V.

Example 3

A device is prepared as in Example 1 with the following differences (see FIGS. 4A to 4K). Between the etching of the Al electrode (e.g. cathode pixels 5a, 5b, . . . ; ) and the deposition of the layer 6 of poly(octylfluorene) the panel is dipped into a breaker 10 containing a 5 mg/mil solution in a mixture of acetonitrile and ethyl alcohol of the following chemical composition for 5 min:

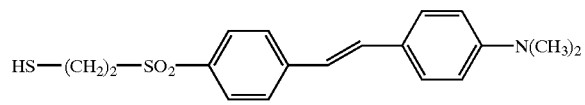

Subsequently the panel is rinsed in ethanol and dried under air at 50° C. for 5 min before deposition of the polymer layer 6. After preparation of the ITO electrodes (e.g. anodes 7a, 7b, . . . ) the second substrate is dipped into a breaker 11 containing a 5 mg/ml solution in a mixture of acetonitrile and ethanol of the following chemical composition for 5 min (FIG. 4D$_1$):

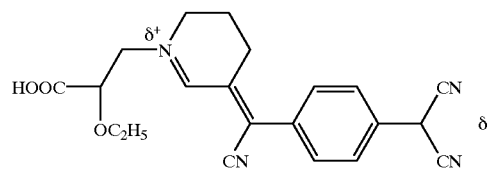

Subsequently the panel is rinsed in ethanol and dried under air at 50° C. for 5 min before deposition of the polymer layer 8. The rest of the preparation is as described in Example 1.

With the process and the arrangement described in this Example a TFT/LEP display with 513000 pixels and a diagonal size of 1.35" (3.43 cm) is obtained having a brightness of 100 Cd/m$^2$ and driving voltages below 12 V.

List of Reference Literature

Lit. [1]: R. Friend, A. Holmes, D. Bradley et al., Nature 347, 539 (1990)

Lit. [2]: Riess, W. "Single- and Heterolayer Polymeric Light Emitting Diodes Based on Poly(p-phenylene vinylene) and Oxdiazole Polymers" Organic electro-luminescent Materials and Devices, edited by Miyata, S. and Nalwa, H. S., Gordon and Breach Science Publishers, Amsterdam, 1997

Lit. [3]: Heeger et al., Nature 357, 477 (1992)

Lit. [4]: Weimer, P. K. (1966) Field Effect Transistors, edited by J. T. Wallmark and H. Johnson, New Jersey, Prentice Hall Lit. [5]: R. Friend et al., Science, in press; home page, Cambridge Display Technology Ltd; www. cdt/bd. co. uk Lit. [6]: M. Bruening, E. Moons, D. Cahen. A. Shanzer, J. Phys. Chem 99, 8368 (1995)

Lit. [7]: F. Nuesch, L. Si-Ahmed, B. Francois, L. Zuppiroli, Adv. Mater. 9, 222 (1997)

Lit. [8]: See, for example, S. A. Giddings, in Encyclopedia of Polymer Science and Technology 2$^{dn}$ Ed., Vol. 8, 617 ff Lit. [9]: R. Friend et al. Nature, in press Lit. [10]: Cabrera, A. Meyer, D. Lupo et al. Nonlinear Optics 9, 161 (1995)

Lit. [11]: D. Bloor et al., J. American Chem. Soc. xx, xxx (xxxx)

What is claimed is:

1. A method for fabricating an active matrix display device formed of a plurality of pixels and comprising:
   at least one thin film transistor element (TFT element) is deposited on a first substrate for each pixel,
   at least the source region (S) and the channel region (C) of said at least one TFT element for each pixel are covered by a non-conductive passivation layer such as to leave parts or all of the drain region (D) uncovered, a cathode material layer structured into a plurality of pixel electrode regions is deposited so as to cover the area covered by each of said TFT elements, a first active organic and/or polymeric electroluminescent material layer (EL layer) is applied to cover at least said pixel electrode regions, a second substrate is separately prepared by depositing an anode layer on one surface of said second substrate and subsequently coating said anode layer with a second active organic and/or polymeric EL material layer, said two substrates thus prepared and coated are laminated together, said first and second EL material layers being face-to-face and appropriately aligned, under application of heat and/or pressure for a predetermined time, the temperature being selected to have a glass transition temperature of at least one of said EL layers in case of a polymeric EL material or to have the phase transition temperature for solid to liquid crystalline state or isotropic state in case of crystalline EL material.

2. The method of claim 1, characterized in that a flattening layer is deposited before or after deposition of said cathod material layer.

3. The method of claim 1, characterized in that after the process of lamination the display device is encapsulated.

4. The method of claim 1, wherein said first substrate is non-transparent, characterized in that a stable metal which is resistant to photolithographic processing is selected for said cathode material layer.

5. The method of claim 4, characterized in that Al or an Al alloy is selected as said stable metal.

6. The method of claim 1, characterized in that at least one of said EL layers is prepared as a laminated composite layer system of a plurality of EL materials.

7. The method of claim 1, characterized in that before applying said EL material layer(s), said cathode material layer and/or said anode layer is/are modified by chemical treatment to adsorb functionalized dipoles.

8. The method of claim 7, characterized in that for optimization of charge carrier injection from said cathode and/or said anode material layer(s), said chemical treatment is selected such that the molecules attached to said cathode and/or said anode layer(s) are of the same functional group for light emission and/or charge transport as the active organic or polymeric EL material which is adjacent to the such modified electrode layer(s).

9. The method of claim 1, characterized in that said heat-supported lamination process of said two EL material coated substrates is performed under a pressure of more than 10 $g/cm^2$.

* * * * *